US006933602B1

(12) United States Patent
Patel et al.

(10) Patent No.: US 6,933,602 B1
(45) Date of Patent: Aug. 23, 2005

(54) SEMICONDUCTOR PACKAGE HAVING A THERMALLY AND ELECTRICALLY CONNECTED HEATSPREADER

(75) Inventors: Pradip Patel, Redwood City, CA (US); Maurice Othieno, Union City, CA (US); Manickam Thavarajah, San Jose, CA (US); Severino A. Legaspi, Jr., Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/620,074

(22) Filed: Jul. 14, 2003

(51) Int. Cl.[7] .......................... H01L 23/48; H05K 7/20
(52) U.S. Cl. ...................... 257/712; 257/738; 257/737; 257/697; 257/778; 257/696; 257/698; 257/675; 257/676; 257/707; 257/734; 257/706; 257/786; 257/784; 257/691; 257/717; 257/720; 257/713; 361/707
(58) Field of Search .............................. 257/712, 713, 257/717, 720, 668, 778, 737, 738, 734, 691, 257/696, 698, 675, 676, 796, 784, 786, 706, 257/707

(56) References Cited

U.S. PATENT DOCUMENTS

| 6,521,990 | B2 * | 2/2003 | Roh et al. .................... 257/706 |
| 6,703,698 | B2 * | 3/2004 | Huang et al. ................ 257/678 |
| 6,737,755 | B1 * | 5/2004 | McLellan et al. ............ 257/796 |
| 2003/0179549 | A1 * | 9/2003 | Zhong et al. ................ 361/707 |
| 2003/0216024 | A1 * | 11/2003 | Shim et al. .................. 438/613 |
| 2004/0065963 | A1 * | 4/2004 | Karnezos ..................... 257/777 |

* cited by examiner

Primary Examiner—Alexander Oscar Williams
(74) Attorney, Agent, or Firm—Beyer Weaver Thomas

(57) ABSTRACT

Embodiments of the invention include a semiconductor integrated circuit package that includes a substrate having an integrated circuit die attached thereto. The substrate includes at least one electrical ground plane and includes a plurality solder balls formed on a surface thereof. The solder balls include a set of "thermal" solder balls that are positioned near the perimeter of the package and electrically connected with a ground plane of the package. The IC die is electrically connected with the ground plane that is connected with the "thermal" solder balls. A heat spreader is mounted on the package with conductive mounting pegs that are electrically connected with the ground plane. The heat spreader is in thermal communication with the die and also in thermal communication with the set of "thermal" solder balls. This configuration enables a portion of the heat generated by the die to be dissipated from the die through the heat spreader into the set of "thermal" solder balls. Additionally, the package can be configured so that the combination of the electrically connected heat spreader, ground plane, and conductive mounting pegs operate together as a electromagnetic shield that reduces the amount of electrical noise of the package.

12 Claims, 3 Drawing Sheets

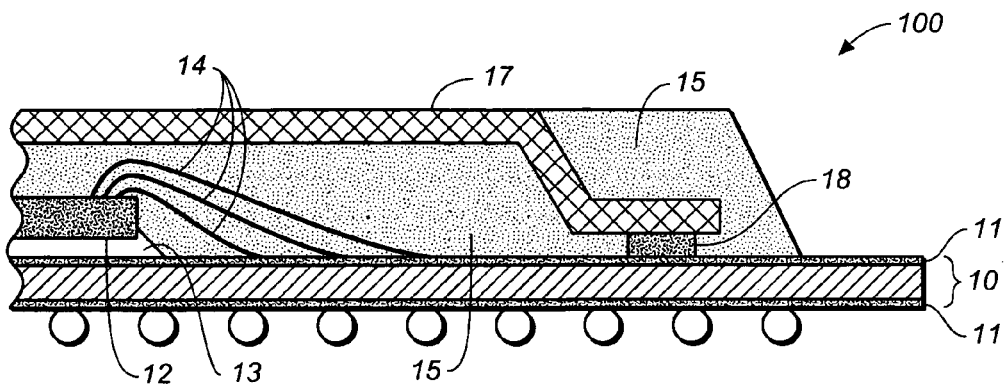
FIG._1(PRIOR ART)
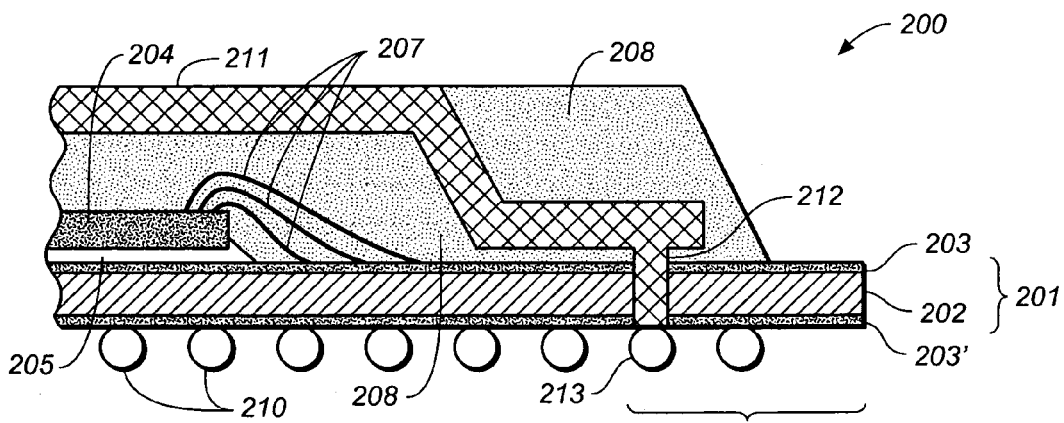
FIG._2
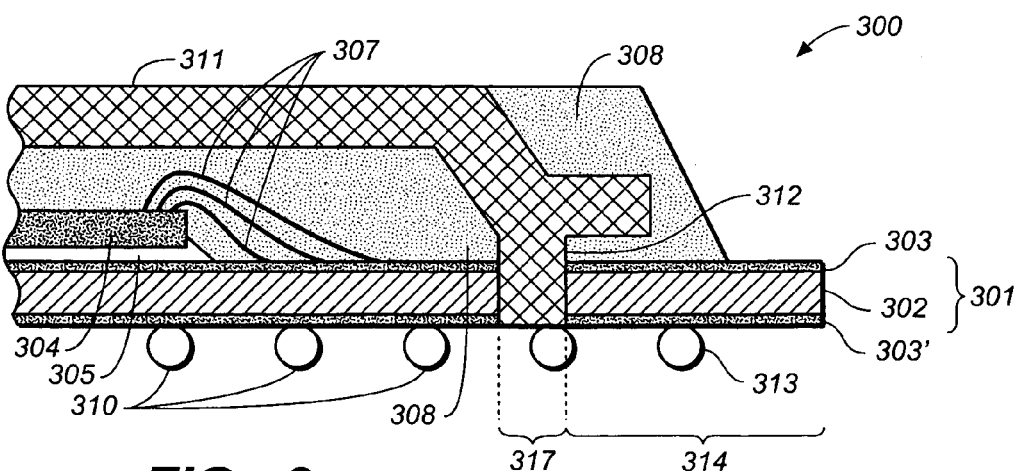
FIG._3

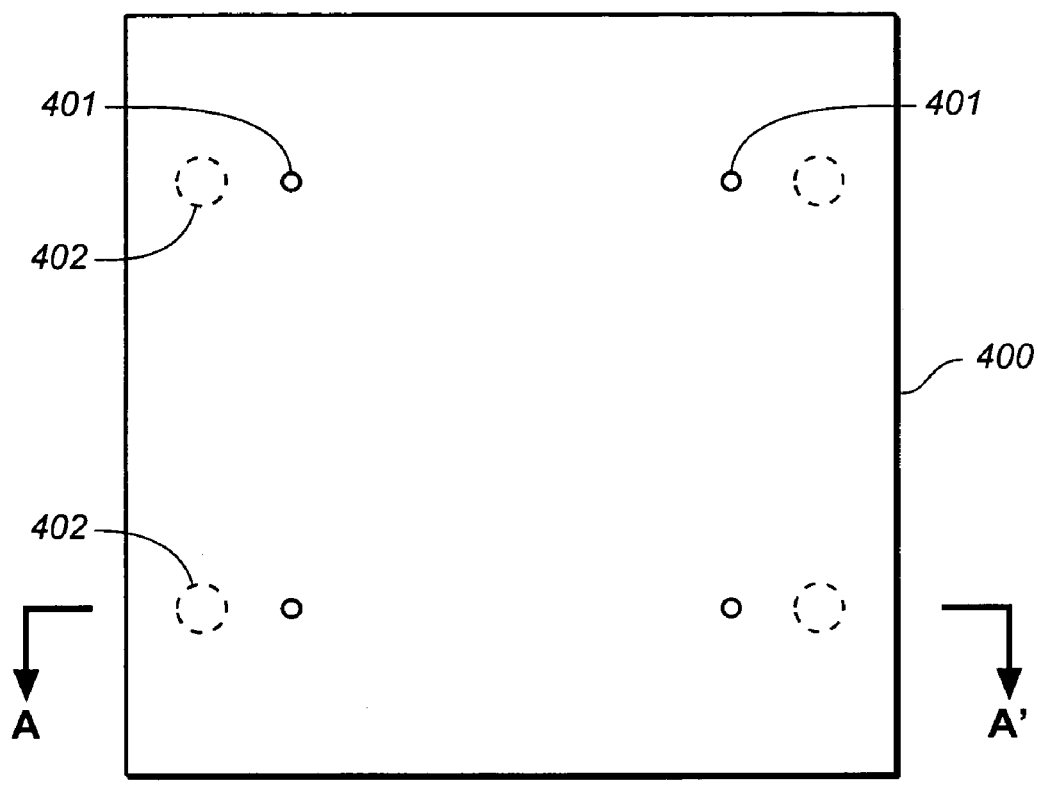
FIG._4a
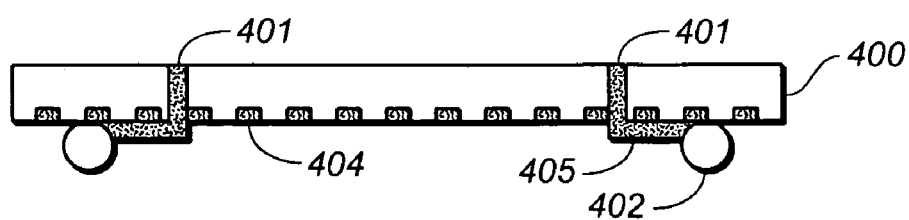
FIG._4b

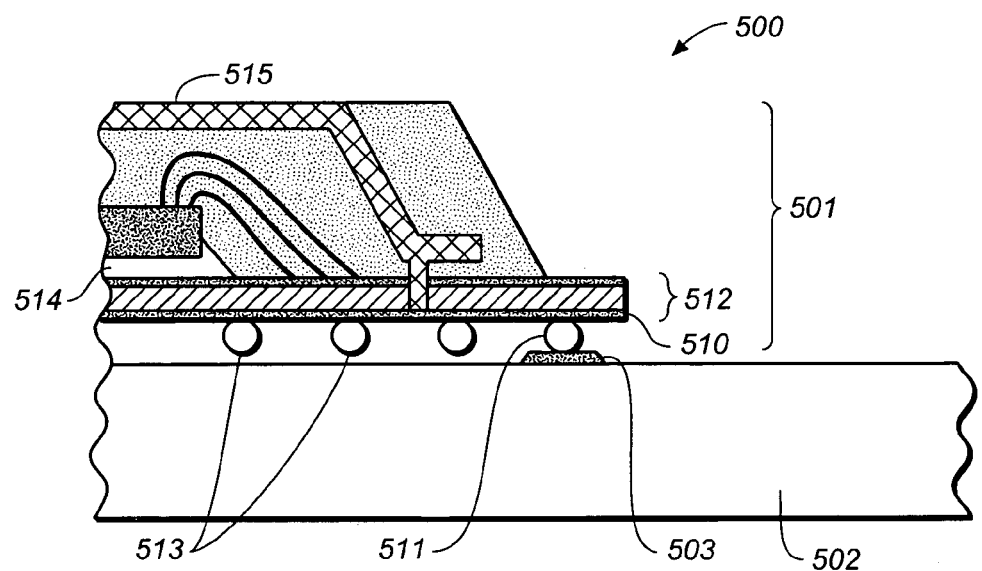
FIG._5a
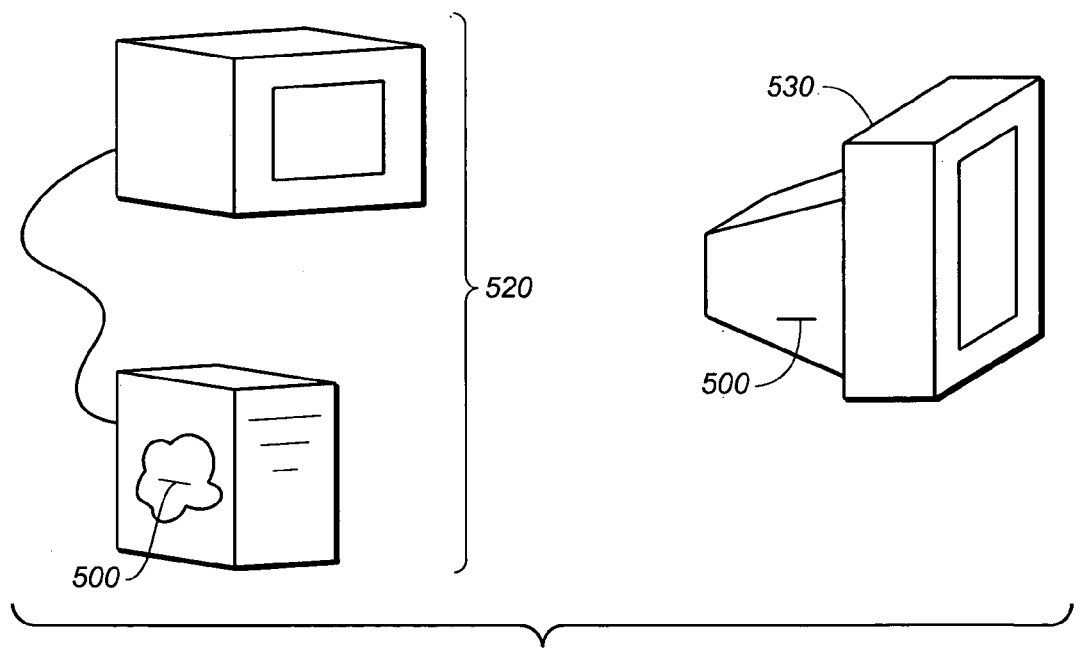
FIG._5b

SEMICONDUCTOR PACKAGE HAVING A THERMALLY AND ELECTRICALLY CONNECTED HEATSPREADER

TECHNICAL FIELD

The invention described herein relates generally to semiconductor device packaging. In particular, the invention relates to a semiconductor device package that constructed such that a heat spreader is electrically and thermally connected with a ground plane of the package thereby increasing the thermal cooling properties of the package as well as improving the noise characteristics of the package.

BACKGROUND

Heat spreaders are generally used in integrated circuit device packages. One such integrated circuit device package 100 is shown in the simplified schematic illustration of FIG. 1. The depicted package 100 is a ball grid array type package. In FIG. 1, there is a substrate 10 onto which an integrated circuit device (also referred to herein as an IC die or chip) 12 is mounted. The die 12 is commonly attached to a front side surface of the substrate 10 with an epoxy layer 13. The depicted substrate 10 includes copper conducting planes 11 that comprise electrical connections in the package 100. The die 12 is electrically connected to selected electrical connections of the copper conducting planes 11 using bonding wires 14. The die 12 is encapsulated with a molding material 15. Additionally, a heat spreader 17 is adhered (commonly using epoxy 18) to the front side surface of the substrate 10 to protect the die 12 and to spread the heat generated by the die 12 over a larger area. Also, typically, a heat sink (not shown) is thermally coupled to the heat spreader 17 and serves to dissipate heat. The outer edges of the package 100 are also encapsulated in a mold material 15 to complete the package 100. Importantly, in conventional packages the heat spreader 17 is attached to the package using an epoxy 18. This epoxy 18 firmly attaches the heat spreader 17 to the package 100 and also electrically insulates the heat spreader 17 from the copper plane 11 on the front side surface of the substrate 10.

Although such conventional implementations have served well for many years they can be improved. As semiconductor devices become faster and more powerful they generate more heat and also generate greater electromagnetic noise and interference. Thus, there is a need for embodiments that can improve the thermal and electrical performance of the package.

SUMMARY OF THE INVENTION

In accordance with the principles of the present invention, an improved semiconductor package and methods for its fabrication are disclosed.

In general, the present invention is directed toward systems and packages that provide improved cooling and reduce the amount of electromagnetic noise generated by such packages and systems.

One embodiment of the invention comprises a semiconductor integrated circuit package. The package includes a substrate with a ground plane with solder balls formed on a surface thereof. The solder balls include a set of "thermal" solder balls positioned near the perimeter of the package. An IC die is mounted to the substrate and electrically connected with some of the solder balls. A heat spreader mounted on the package in thermal communication with the die and with the set of "thermal" solder balls. This enables a portion of the heat generated by the die to be dissipated from the die through the heat spreader into the set of "thermal" solder balls which are located near the perimeter of the substrate.

In another embodiment of the invention the IC package comprises a substrate having at least one electrical ground plane and having a plurality solder balls formed on a surface thereof. The solder balls include a set of "thermal" solder balls that are positioned near the perimeter of the package and electrically connected with a ground plane of the package. The package includes an IC die mounted to the substrate such that the die is electrically connected with some of the solder balls. A heat spreader is mounted on the package with conductive mounting pegs that are electrically connected with the ground plane and such that the heat spreader is in thermal communication with the die and in thermal communication with the set of "thermal" solder balls thereby enabling a portion of the heat generated by the die to be dissipated from the die through the heat spreader into the set of "thermal" solder balls. The package is configured so that the combination of the electrically connected heat spreader, ground plane, and conductive mounting pegs operate together as a electromagnetic shield that reduces the amount of electrical noise of the package.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIG. 1 is a simplified schematic cross section view of a portion of a conventional integrated circuit package used to package semiconductor IC chips.

FIG. 2 is simplified cross-sectional view of a semiconductor package embodiment having a heat spreader connected to "thermal" solder balls in accordance with the principles of the invention.

FIG. 3 is simplified cross-sectional view of another semiconductor package embodiment having a heat spreader connected to a package ground plane and to "thermal" solder balls in accordance with the principles of the invention.

FIGS. 4(*a*) and 4(*b*) are plan and cross-section views of a substrate embodiment suitable for practicing the invention.

FIG. 5(*a*) is simplified cross-sectional view a semiconductor package embodiment incorporated with a system board in accordance with the principles of the invention.

FIG. 5(*b*) is simplified illustration of several different electronic devices that can incorporate packages and systems constructed in accordance with the principles of the invention.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, semiconductor device package embodiments will be disclosed. In particular, the depicted structures depict package embodiments having heat spreaders attached to the package in a manner suitable for effectively dissipating heat from a die into solder balls arranged along the outer portions of the package. Such packages provide improved heat dissipation performance relative to conventional packages. Additionally, embodiments of the invention include packages configured such that the heat spreader is electrically connected with a ground plane of the package. In such embodiments the ground plane is electrically connected with "thermal" solder balls formed near the perimeter of the package. Such packages demonstrate superior thermal properties relative to conventional packages and also provide superior electrical performance by reducing the overall package noise. In such implementations the heat spreader electrically connected to the ground plane operates as a electromagnetic shield to reduce the electrical noise of the package.

FIG. 2 depicts one embodiment of a semiconductor package 200 constructed in accordance with the principles of the invention. The depicted embodiment is a simplified cross-section view of a package embodiment constructed in accordance with the principles of the invention. The depicted embodiment includes a substrate 201 upon which an integrated circuit die 204 is mounted. In the depicted embodiment, the substrate 201 comprises a standard two level PBGA (plastic ball grid array) substrate. Typically, such substrates 201 include a core 202 sandwiched between two metallization layers 203, 203' which also typically include layers of solder mask (not shown). Most commonly, the core 202 is formed of fiber material suspended in a cured BT (bismaleimide triazine) resin material. This core 202 is then treated to form metallization layers 203. Commonly, copper materials or coated copper materials are used. Other conductive materials are also used. A solder mask layer is then typically formed over the metallization layers 203, 203' and photolithographically patterned to create a solder mask that defines a corresponding pattern in the metallization layers 203, 203'. Such substrates 201 are commonly very thin, on the order of about 0.50–0.60 mm thick. Additionally, the metallization layers 203, 203' can be used to define ground planes (as well as many other different types of electrical connections). For example, metallization layer 203' can define a ground plane. Additionally, solder balls 210 are attached to a backside surface of the substrate 201 to facilitate the physical and electrical connection of the package 200 to a system board (e.g., a motherboard). The methods of constructing such substrates 201 are very well known to those having ordinary skill in the art.

An integrated circuit (IC) die 204 is attached to a front side surface of the substrate 201. Commonly, such attachment is accomplished using an adhesive (e.g., epoxy) 205. As with conventional embodiments, the die 204 is electrically connected to selected electrical connections of the metallization layers 203, 203' using bonding wires 207 (which can also connect to underlying metallization layers 203' using conducting vias that penetrate through the substrate 201). The die 204 and bonding wires 207 are encapsulated using a molding material 208 that protects and seals the inner components of the package 200. Such molding materials are commercially available and well known in the art. Up until now, the package 200 is very similar to conventional packages. In a novel aspect, the depicted embodiment includes a heat spreader 211 having conductive mounting pegs 212. The heat spreader 211 is mounted to the substrate 201 using the conductive mounting pegs 212. The conductive mounting pegs 212 can be fitted into ordinary (e.g., 200 micron diameter) vias formed in the substrate 201. The conductive mounting peg 212 is connected with "thermal" solder balls 213 that formed on the backside surface of the substrate 201. Importantly, the "thermal" solder balls 213 are positioned near the perimeter 214 of the package. The conductive mounting pegs 212 are connected with "thermal" solder balls 213 such that a heat conduction path is formed allowing heat to flow from the die 204 into the heat spreader 211 through the conductive mounting pegs 212 and into the "thermal" solder balls 213. The "thermal" solder balls 213 are positioned near the perimeter 214 of the package so that when the package 200 is mounted to a system board (e.g. a motherboard) the proximity of the "thermal" solder balls 213 to the edge of the package enables the easy cooling of the balls 213 when exposed to the ambient (and thereby the enhanced cooling of the die 204). The use of mounting pegs 212 makes the assembly of the package 200 a very simple operation. In the most preferred embodiment, four pegs 212 (and their associated vias) are used to mount the heat spreader 211. Obviously, pegs and vias having larger diameters are more efficient at heat treansfer, as are implementations having more pegs and vias.

Another more preferred embodiment is depicted in the simplified cross-section view of FIG. 3. The depicted embodiment includes a substrate 301 upon which an integrated circuit die 304 is mounted. In the depicted embodiment, the substrate 201 comprises a standard two level PBGA (plastic ball grid array) substrate. As before, such substrates 301 typically include a core 302 sandwiched between two metallization layers 303, 303'. A BT core 302 is typically used, with the metallization layers 303, 303' typically comprising copper materials or copper materials coated with a protective conductive material. Other conductive materials can also be used. As before the metallization layers 303, 303' are typically patterned into a desired configuration using photolithographic processes. Additionally, the metallization layers 303, 303' can be used to define ground planes (as well as many other different types of electrical connections). In this embodiment, the metallization layer 203' is used to define a ground plane. Solder balls 310 are attached to a backside surface of the substrate 301 to facilitate the physical and electrical connection of the package 300 to a system board (e.g., a motherboard). The methods of constructing such substrates 301 within the ordinary skill in the art.

As before, an integrated circuit (IC) die 304 is attached to a front side surface of the substrate 301. Commonly, such attachment is accomplished using an adhesive (e.g., epoxy) 305. The die 304 is electrically connected to selected electrical connections of the metallization layers 303 and ground plane 303' using, for example, the bonding wires 307. Electrical connections are also established using conducting vias that penetrate through the substrate 301. The die 304 and bonding wires 307 are encapsulated using molding material 308 that protects and seals the inner components of the package 300.

The depicted embodiment includes a heat spreader 311 as described in the discussion of FIG. 2. The heat spreader 311 includes conductive mounting pegs 312. The heat spreader 311 is typically formed of thermally conductive materials (e.g., aluminum). The heat spreader 311 is mounted to the substrate 301 such that the conductive mounting pegs 312 are in electrical contact with the ground plane 303'. Again, the conductive mounting pegs 312 can be fitted into ordinary (e.g., 200 micron diameter) vias 317 formed in the substrate 301. The vias 317 are constructed to permit the conductive mounting pegs 312 to pass through the substrate 301 and electrically connect to the ground plane 303'. In other embodiments, metallization layer 303' can be a ground line (rather than an entire ground plane) electrically connected to ground solder balls. In the depicted embodiment, the ground plane 303' is connected to a ground plane 303' which is electrically connected to "thermal" solder balls 313 formed on the backside surface of the substrate 301. Importantly, the "thermal" solder balls 313 are positioned near the perimeter 314 of the package to enable cooling of the balls 313. Consequently, a heat conduction path is formed allowing heat to flow from the die 304 into the heat spreader 311 through the conductive mounting pegs 312 and into the "thermal" solder balls 313. The "thermal" solder balls 313 are positioned near the perimeter 314 of the package so that when the package 300 is mounted to a system board (e.g. a motherboard) the proximity of the "thermal" solder balls 313 to the edge of the package enables the easy cooling of the balls 313 when exposed to the ambient (and thereby the enhanced cooling of the die 304). Additionally, the use of mounting pegs 312 makes the assembly of the package 300 a very simple operation.

Another particularly advantageous feature of the embodiment described with respect to FIG. 3 is that the electrical connection of the heat spreader 311 and ground plane 303' operates to reduce the amount of electro-magnetic noise generated by the package 300. The heat spreader 311 and ground plane 303' operate together as a conductive shield. In this manner, a conductive shield is formed about the die 304 that will confine most of the electromagnetic energy radiated by the die 304 within a bounded area defined by the heat spreader 311, ground plane 303', and the mounting pegs 312. A conductive shield such as this is known as a Electromagnetic shield. Additionally, in some embodiments, the spacing between the mounting pegs 312 can be increased to contain higher frequencies.

The outer portion of the package is encapsulated by mold material 308 to form a mold cap that encapsulates and protects the inner components. In general, a substantial portion of the upper surface of the heat spreader 311 is left unencapsulated in order to enhance the heat transfer capacity of the heat spreader 311.

One embodiment of a substrate 400 suitable for use in accordance with the principles of the invention is depicted in FIGS. 4(a) and 4(b). The depicted substrate 400 is a simplified schematic depiction. Referring to FIG. 4(a), the front side surface of substrate 400 is depicted. Selected vias 401 penetrate through the substrate 400 to electrically connect with portions of the ground plane that can be formed on a backside of the substrate 400. Additionally, the inventors contemplate embodiments having internal ground planes (ground planes located within the substrate). Also the substrate can use additional ground lines. The dotted circles indicate the locations of "thermal" solder balls 402. In preferred embodiments, the "thermal" solder balls 402 are electrically connected with at least one ground plane. In most conventional substrates, the solder balls connected with the ground plane are located near the center of the substrate. This allows easy interconnection with a die mounted on the substrate, but also is a disadvantageous location for a "thermal" solder ball 402 which should have relatively unrestricted access to the ambient thereby facilitating cooling of the balls 402. As a result, preferred substrate 400 embodiments include the "thermal" solder balls 402 near the outer perimeter of the substrate 400.

FIG. 4(b) is a simplified schematic cross-section view of the substrate 400 shown in FIG. 4(a) as viewed along axis A–A'. The "thermal" solder balls 402 are clearly depicted on the back side surface of the substrate 400. The vias 401 are depicted penetrating through the substrate 400 where they are electrically connected with, for example, a backside ground plane (the dotted line 404). In the depicted embodiment, electrical leads 405 electrically connect the vias 401 with the "thermal" solder balls 402 so that the "thermal" solder balls 402 can be positioned further away from the center of the substrate and nearer to outer edges of the substrate 400.

The packages described herein with respect to FIGS. 2 and 3 can be implemented in a device as schematically illustrated in FIGS. 5(a) and 5(b). FIG. 5(a) depicts a system 500 including a package 501 in accordance with the principles of the invention mounted on a system board 502. The package 501 can be of a type described in the previously described or similar embodiments constructed in accordance with the principles of the invention. The system board 502 can be any of a number of different printed circuit boards (PCB's) as are typically used in electronic system components. One example of such a system board 502 is, for example, a motherboard. Many other types of system boards can be used in accordance with the principles of the invention. The system board 502 includes a system ground 503 which is electrically grounded and is depicted here as being electrically connected to a ground line (e.g., a ground plane) 510 of the package 501 using "thermal" solder balls 511 formed near the edges of the package 501. As described hereinabove, the package 501 can include a substrate 512 having at least one ground line (or ground plane) 510 and a plurality of solder balls 513 formed on a surface thereof. The solder balls 513 include a sub-group of solder balls comprising a set of "thermal" solder balls 511 formed near the edges of the substrate. The package 501 includes an integrated circuit die 514 electrically connected to the ground line 510 which is connected to at least some of the solder balls 511, 513. The package 501 includes a heat spreader 515 mounted in thermal communication with the integrated circuit die 514 and electrically connected to the ground line 510 and thereby electrically connected to the "thermal" solder balls 511 such that the ground line 510, and heat spreader 515 operate to reduce electrical noise generated by the package 501 (specifically the electromagnetic noise generated by the die 514). Typically, the package 501 is mounted to the system board 502 by reflowing the solder balls 511, 513. The ground line 510 of the package 501 is electrically connected with the system ground 503. In such a configuration a portion of the heat generated by the die 514 can be dissipated by the heat spreader 515 through the ground line 510 into the "thermal" solder balls 511 and into the system board 502. As explained herein above, the electrical connection of the heat spreader 515 to the ground line 510 enhances the noise characteristics of the package 501 and thereby, the system 500.

The system 500 of FIG. 5(a) can be incorporated into many different devices such as is schematically depicted in FIG. 5(b). Examples include, but are not limited to computer systems 520, televisions 530, as well as any other electronic devices that incorporate an integrated circuit package. The system 500 is merely integrated into the relevant electronic device.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that support elements constructed for the purpose of increasing the rigidity of a semiconductor package can be formed on the package in any configuration. Although only two configurations are expressly disclosed herein, it should be appreciated by anyone having ordinary skill in the art that, using the teachings disclosed herein, many different package support configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A semiconductor integrated circuit (IC) package comprising:
    a substrate including at least one electrical ground plane and having a plurality solder balls formed on a surface thereof, said solder balls including a set of thermal solder balls comprising the outermost row of solder balls positioned near the perimeter of the package wherein the set of thermal solder balls is electrically connected to said at least one electrical ground plane;
    an integrated circuit die mounted to the substrate such that the die is electrically connected with some of the solder balls; and
    a heat spreader mounted on the package such that the heat spreader is in thermal communication with the die and also in thermal communication with the outermost row of solder balls of the package thereby enabling a portion of the heat generated by the die to be dissipated from the die through the heat spreader into the outermost row of solder balls and wherein the heat spreader, the at least one electrical ground plane, and the outermost row of solder balls are arranged so that heat generated by the die can be dissipated from the die through the heat spreader into the at least one electrical ground plane and into the outermost row of solder balls.

2. The IC package of claim 1 wherein the heat spreader electrically connected to the at least one ground plane operates to reduce electrical noise generated by the package.

3. The IC package of claim 2 wherein the heat spreader is mounted to the package using thermally conductive mounting pegs and wherein the heat spreader is connected to the outermost row of solder balls using conductive mounting pegs and wherein the heat spreader forms part of an electromagnetic shield that reduces the overall electrical noise generated by the package.

4. The IC package of claim 2 wherein the heat spreader is mounted to the package using thermally conductive mounting pegs and wherein the heat spreader is connected to the outermost row of solder balls using conductive mounting pegs and wherein the heat spreader, conductive mounting pegs, and the outermost row of solder balls form, in combination, part of a electromagnetic shield that reduces the overall electrical noised generated by the package.

5. The IC package of claim 1 wherein the package comprises a ball grid array package.

6. A semiconductor integrated circuit (IC) package comprising:
    a substrate including at least one electrical ground plane and having a plurality solder balls formed on a surface thereof, said solder balls including a set of thermal solder balls electrically connected with a ground plane and positioned near the perimeter of the package;
    an integrated circuit die mounted to the substrate such that the die is electrically connected with some of the solder balls;
    a heat spreader mounted on the package with conductive mounting pegs that are electrically connected with at least one of the at least one ground plane and such that the heat spreader is in thermal communication with the die and in thermal communication with the set of thermal solder balls thereby enabling a portion of the heat generated by the die to be dissipated from the die through the heat spreader into the set of thermal solder balls; and
    the combination of the electrically connected heat spreader, ground plane, and conductive mounting pegs operating together as a electromagnetic shield that reduces the amount of electrical noise of the package.

7. An electronic device incorporating the IC package of claim 6.

8. An electronic device incorporating the IC package of claim 6 wherein the electronic device comprises a computer.

9. A semiconductor integrated circuit (IC) package comprising:
    a substrate including at least one electrical ground plane and having a plurality solder balls formed on a back surface thereof, said solder balls including a set of thermal solder balls positioned near the perimeter of the package;
    an integrated circuit die mounted to the substrate such that the die is electrically connected with some of the solder balls; and
    a heat spreader mounted on the package using conductive mounting pegs that pass through the substrate such that the heat spreader is in thermal communication with the die and such that the conductive mounting pegs contact leads formed on the back surface of the substrate and extend outward from the middle of the substrate to the set of thermal solder balls positioned near the perimeter of the package thereby enabling a portion of the heat generated by the die to be dissipated from the die through the heat spreader into the set of thermal solder balls.

10. The IC package of claim 9 wherein the heat spreader electrically connected to the at least one ground plane operates to reduce electrical noise generated by the package.

11. The IC package of claim 10 wherein the combination of the heat spreader, conductive mounting pegs, and at least one ground plane forms part of a electromagnetic shield that reduces the overall electrical noise generated by the package.

12. The IC package of claim 9 wherein the package comprises a ball grid array package.

* * * * *